United States Patent [19]
Cook

[11] Patent Number: 4,594,128
[45] Date of Patent: Jun. 10, 1986

[54] LIQUID PHASE EPITAXY

[76] Inventor: Melvin S. Cook, P.O. Box 38, Saddle River, N.J. 07458

[21] Appl. No.: 590,469

[22] Filed: Mar. 16, 1984

[51] Int. Cl.$^4$ ............................................. C30B 19/02
[52] U.S. Cl. ................................................... 156/622
[58] Field of Search ........................... 427/86; 148/171; 156/622, 624, 608, 623 R, DIG. 97, DIG. 70, 621; 422/56, 45, 253

[56] References Cited

U.S. PATENT DOCUMENTS

| | | | |
|---|---|---|---|
| Re. 28,140 | 8/1974 | Bergh et al. ........................ | 156/624 |
| 2,204,180 | 6/1940 | Gerlach ........................... | 156/623 R |
| 3,249,404 | 5/1966 | Bennett ............................ | 156/608 |
| 3,880,690 | 4/1975 | Weyrich et al. .................... | 148/171 |
| 3,889,635 | 6/1975 | Aengenheister .................... | 148/171 |
| 3,990,392 | 11/1976 | Andre ............................. | 156/622 |
| 4,052,252 | 10/1977 | Lockwood ......................... | 156/622 |
| 4,315,796 | 2/1982 | Nishizawa ......................... | 156/622 |
| 4,319,953 | 3/1982 | Grabmaier ........................ | 156/622 |
| 4,357,200 | 11/1982 | Grabmaier ........................ | 427/86 |

FOREIGN PATENT DOCUMENTS 2074469 11/1981 United Kingdom ............... 156/622

*Primary Examiner*—Hiram H. Bernstein
*Attorney, Agent, or Firm*—Gottlieb, Rackman & Reisman

[57] ABSTRACT

An apparatus and a method for the growth of an epitaxial layer on a substrate from a solution. Solution is brought into contact with a substrate in a narrow channel. Cooling fluid flowing through a second channel maintains the substrate temperature below the saturation temperature of the solution, and heating fluid flowing through a third channel maintains the wall of the narrow channel opposite the substrate above the saturation temperature of the solution.

6 Claims, 3 Drawing Figures

LIQUID PHASE EPITAXY

This invention relates to low-cost growth of epitaxial layers on substrates by liquid phase epitaxy. It can be used, for example, to grow epitaxial semiconductor layers on crystalline substrates in the manufacture of electronic devices.

Liquid phase epitaxy enables growth of epitaxial layers of excellent crystalline quality. However, its use has been impeded as a result of the low productivity that has been associated with this process since this leads to high product cost.

It is an object of my invention to provide a method and an apparatus for low-cost growth of epitaxial layers on substrates.

Briefly, in accordance with the principles of my invention and in the preferred embodiment thereof, a substrate is brought into contact with solution in a narrow channel. For the purposes of the present invention, a narrow channel has a wide dimension or breadth that accommodates the substrate and a narrow dimension orthogonal to the wide dimension or depth which is one-tenth or less the magnitude of the wide dimension.

Cooling fluid circulating in a second channel maintains the temperature of the substrate below the saturation temperature of the solution in contact with the surface of the substrate. The narrow channel wall opposite to the substrate is maintained above the saturation temperature of the solution in contact with it by means of heating fluid circulating in a third channel. The use of the cooling and heating fluids enables establishment of a thermal gradient in the solution proximate to the substrate sufficient in magnitude to inhibit the appearance of stable crystallites in the solution proximate to the substrate which could degrade the crystalline quality of the epitaxial layer that will form. The narrow channel, by limiting the thickness of the solution between the substrate and the opposite wall of the narrow channel, assists in the establishment of a large thermal gradient in the solution proximate to the substrate surface on which the epitaxial layer grows. Such a limitation also helps inhibit the appearance of convention currents in the solution in this region which could degrade crystalline quality.

If the substrate temperature is held well below the initial saturation temperature of the solution, rapid growth of epitaxial layers of good crystalline quality can result.

Further objects, features, and advantages of my invention will become apparent upon consideration of the following detailed description in conjunction with the drawing, in which.

Figure 1:
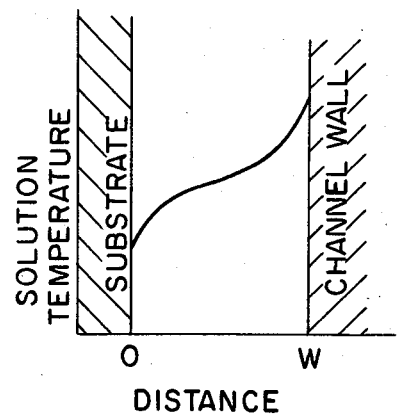
FIG. 1 represents the temperature distribution in the solution in a narrow channel.

In FIG. 1, the temperature distribution in the solution proximate to a substrate in a narrow channel is shown as a function of distance along the narrow dimensions or depth of the narrow channel. The magnitude of the narrow dimension is w. The increase of temperature with distance from the substrate surface must be sufficient to inhibit the appearance of stable crystallites in the solution away from the substrate surface.

Figure 2:
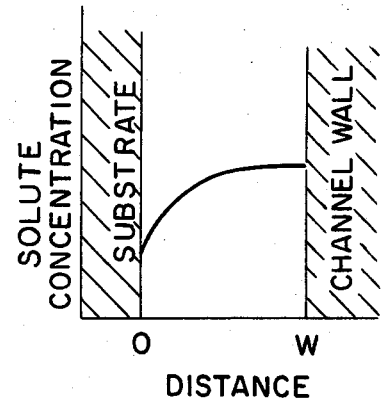
FIG. 2 represents the solute distribution of the solution in a narrow channel.

In FIG. 2, the solute concentation in the solution proximate to the surface of a substrate in a narrow channel with narrow dimension w is shown as a function of distance from the surface of the substrate. As the solute concentration increases, so also does the saturation temperature of the solution. If the temperature distribution corresponds to that shown in FIG. 1, and the temperature at all points exceeds the saturation temperature, then stable crysallites will not appear in the solution away from the surface of the substrate. This condition can be achieved if the temperature gradient in the solution is maintained sufficiently large in magnitude and if the solution does not exhibit substantial flow in the narrow channel, both of which are assisted by use of a narrow channel with sufficiently small value of w.

Figure 3:
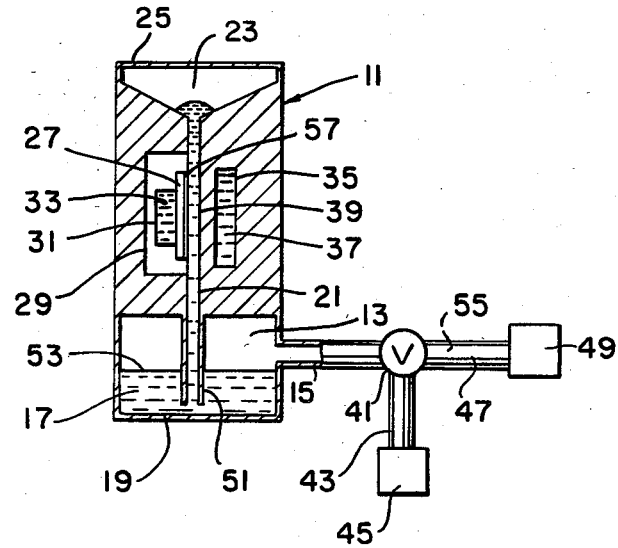
FIG. 3 is a schematic representation, partially in section, of an apparatus for the growth of epitaxial layers on substrates from solutions.

In FIG. 3, apparatus 11 for the growth of epitaxial layers from solution is shown schematically, partially in section. Gas 55, for example, hydrogen gas, enters space 13 via tube 47 through valve 41 and via tube 15 from gas tank 49 when valve 41 is in its appropriate setting in order to force solution 17 into narrow channel 21 since when the gas pressure in space 13 is increased sufficiently, some of solution 17 from well 19 will move up into the narrow channel 21 due to the fact that the inlet 51 to the narrow channel 21 is below the surface 53 of the solution in the well. If any excess of solution moves into the narrow channel after the latter has been filled, it will enter overflow space 23 of the overflow chamber 25. When the narrow channel is filled with solution, the growth of an epitaxial layer 57 on the substrate 27 takes place once the substrate is positioned at one side of the channel, and after the growth process is completed, the solution in the narrow channel may be withdrawn from it by reducing the gas pressure in space 13. Such a reduction in gas pressure can be accomplished by putting valve 41 to a second setting in which it connects space 13 via tubes 15 and 43 to gas pump 45.

Substrate 27 is shown in contact with solution in the narrow channel. Slider 29, which moves in a direction orthogonal to the plane of FIG. 3, brings the substrate into the narrow channel to commence the epitaxial layer growth process, and removes the substrate from the narrow channel when the epitaxial layer has been grown on the substrate.

Cooling fluid 33 circulates in cooling fluid channel 31. The cooling fluid influences the substrate temperature and maintains it below the saturation temperature of the contacting solution. This results in the growth of an epitaxial layer on the substrate. If the cooling fluid maintains the temperature of the substrate sufficiently low as to induce a condition of substantial supersaturation with respect to the bulk of the solution in the narrow channel, then rapid growth of the epitaxial layer on the substrate will occur.

Heating fluid 37 circulates in heating fluid channel 35. The heating fluid influences the temperature of the wall 39 of the narrow channel located opposite to the substrate surface on which the epitaxial layer grows. By maintaining this temperature above the saturation temperature of the bulk of the solution in the narrow channel, a temperature distribution in the channel is maintained which inhibits the appearance of stable crystallites in the solution away from the substrate. In other words, the heaing fluid helps to maintain a sufficiently large temperature gradient in the solution to prevent the degradation of the crystalline quality of the epitaxial layer. Gas, for example, hydrogen gas, is often an acceptble heating fluid or cooling fluid provided it is supplied to the heating fluid channel or the cooling fluid channel at an appropriate temperature so as to accomplish its heating or cooling function, respectively. Sources of heating fluid or cooling fluid are not shown, but any of conventional sources may be used.

If the solution in the narrow channel has been substantially depleted of solute but the epitaxial layer has not reached the thickness desired, then the solution can be withdrawn from the narrow channel and fresh solution introduced. By such means, the thickness of the epitaxial layer can be increased.

While the solution 17 in well 19 can be held in a saturated or in an unsaturated condition, the latter condition is preferable in that it helps to avoid the appearance or persistence of stable crystallites in the solution.

The use of gas pressure to move solution into the narrow channel is preferable to the use of mechanical means for this purpose-although such mechanical means may also be employed-since it lends itself to easier use in a production environment.

In order to maintain apparatus 11 at an appropriate temperature, it may be placed in an oven. While an oven is not shown in FIG. 3, any of conventional ovens can be used for this purpose.

In a particular example, the substrate is composed of crystalline gallium arsenide held at 780° Centigrade, and the solution is a gallium solution of gallium arsenide brought into the narrow channel at a temperature of 790° Centigrade and with a saturation temperature of 785° Centigrade. The initial rate of growth of a gallium arsenide epitaxial layer on the substrate is of the order of one micrometer per minute.

Under conditions leading to rapid growth of epitaxial layers, the distribution coefficients of impurities approach unity and the composition of ternary or quaternary layers tends to be constant. This is desirable in that it aids obtaining epitaxial layers of uniform composition.

Although the invention has been described with reference to particular embodiments, it is to be understood that these embodiments are merely illustrative of the application of the principles of the invention. Numerous modifications may be made therein and other arrangements may be devised without departing from the spirit and scope of the invention.

I claim:

1. A method of growing an epitaxial layer of a material on a surface of a substrate from a solution, comprising the steps of positioning said substrate at a first side of a first channel having an inlet communicating with a solution reservoir, forcing at least part of said solution from said solution reservoir to flow into said first channel via said inlet only until said first channel is substantially filled with said at least part of said solution in the vicinity of said substrate where epitaxial growth of material on said surface is desired, and maintaining the temperature of said substrate at a value below the saturation temperature of said at least part of said solution by passing a cooling fluid through a second channel in heat exchange relationship with said substrate, thereby causing material to deposit onto said surface of said substrate from said at least part of said solution while the latter is stationary in said first channel and said epitaxial layer to grow on said surface, said first channel at said surface of said substrate having a breadth which in magnitude is at least ten times the magnitude of the depth of said first channel.

2. A method of growing an epitaxial layer on a substrate from a solution in accordance with claim 1, wherein the temperature of the wall of said first channel at a second side thereof opposite the first side where said substrate is located is maintained above the saturation temperature of said at least part of said solution by passing a heating fluid through a third channel in heat exchange relationship with said wall.

3. A method of growing an epitaxial layer on a substrate from a solution in accordance with claim 1, wherein said at least part of said solution enters said first channel and is brought into contact with said substrate by gas pressure on said solution.

4. A method of growing an epitaxial layer on a substrate from a solution in accordance with claim 2, wherein said at least part of said solution enters said first channel and is brought into contact with said substrate by gas pressure on said solution.

5. A method of growing an epitaxial layer on a substrate from a solution in accordance with claim 3, wherein after the epitaxial growth of material on said surface is completed, the remainder of said at least part of said solution in said first channel is removed from contact with said substrate by gas pressure on said solution.

6. A method of growing an epitaxial layer on a substrate from a solution in accordance with claim 4, wherein after the epitaxial growth of material on said surface is completed, the remainder of said at least part of said solution in said first channel is removed from contact with said substrate by gas pressure on said solution.

* * * * *